(12) United States Patent
Choi et al.

(10) Patent No.: US 10,438,873 B2
(45) Date of Patent: Oct. 8, 2019

(54) SEMICONDUCTOR CHIP PACKAGE HAVING HEAT DISSIPATING STRUCTURE

(71) Applicant: JMJ KOREA CO., LTD., Bucheon-si (KR)

(72) Inventors: Yunhwa Choi, Bucheon-si (KR); Jeonghun Cho, Goyang-si (KR)

(73) Assignee: JMJ KOREA CO., LTD., Bucheon-si (KR)

( * ) Notice: Subject to any disclaimer, the term of this patent is extended or adjusted under 35 U.S.C. 154(b) by 7 days.

(21) Appl. No.: 15/617,126

(22) Filed: Jun. 8, 2017

(65) Prior Publication Data

US 2018/0040541 A1 Feb. 8, 2018

(30) Foreign Application Priority Data

Aug. 4, 2016 (KR) .......................... 10-2016-0099315

(51) Int. Cl.
| | |
|---|---|
| *H01L 21/00* | (2006.01) |
| *H01L 23/495* | (2006.01) |
| *H01L 23/31* | (2006.01) |
| *H01L 23/36* | (2006.01) |
| *H01L 23/433* | (2006.01) |

(52) U.S. Cl.
CPC .... *H01L 23/49568* (2013.01); *H01L 23/3114* (2013.01); *H01L 23/36* (2013.01); *H01L 23/4334* (2013.01); *H01L 23/4951* (2013.01); *H01L 23/49524* (2013.01); *H01L 23/49531* (2013.01); *H01L 23/49541* (2013.01); *H01L 23/49551* (2013.01); *H01L 23/3107* (2013.01); *H01L 2224/16245* (2013.01); *H01L 2924/181* (2013.01)

(58) Field of Classification Search
None
See application file for complete search history.

(56) References Cited

U.S. PATENT DOCUMENTS 5,668,404 A * 9/1997 Abe ...................... H01L 21/565
257/668
5,731,631 A * 3/1998 Yama ...................... H01L 21/56
257/702

(Continued)

FOREIGN PATENT DOCUMENTS

JP 2012-253118 A 12/2012
KR 10-1998-0012307 A 4/1998

(Continued)

*Primary Examiner* — Reema Patel
(74) *Attorney, Agent, or Firm* — KORUS Patent, LLC; Seong Il Jeong

(57) ABSTRACT

Disclosed herein is a semiconductor chip package having a heat dissipating structure. The semiconductor chip package including: a semiconductor chip configured such that a plurality of terminals protrudes from the upper surface thereof; lead frames connected to the terminals located on the upper surface of the semiconductor chip; and a package body configured to protect the semiconductor chip and the lead frames and to form the outside shape of the semiconductor chip package, and formed by molding. The lower surfaces of the lead frames are exposed to the outside. The lower surface of the package body is partially cut out such that the bottom surface of the semiconductor chip is exposed to the outside.

3 Claims, 14 Drawing Sheets

(56) References Cited

U.S. PATENT DOCUMENTS

2013/0285260 A1* 10/2013 Denison .................. H01L 25/07
257/777
2015/0091164 A1* 4/2015 Yamagami ........ H01L 23/49524
257/737

FOREIGN PATENT DOCUMENTS

KR 10-2009-0104477 A 10/2009
KR 10-2010-0069006 A 6/2010

* cited by examiner

SEMICONDUCTOR CHIP PACKAGE HAVING HEAT DISSIPATING STRUCTURE

BACKGROUND

1. Technical Field

The present invention relates generally to a semiconductor chip package having a heat dissipating structure, and more particularly to a semiconductor chip package having a heat dissipating structure, which enables the heat, generated in a semiconductor chip, to be easily dissipated from a package to the outside, thereby preventing the chip from being erroneously operated or damaged, and also improving durability.

2. Description of the Related Art

Generally, semiconductor chip packages are each constructed by mounting a semiconductor chip on a substrate and molding a package body through the application of a thermosetting material, such as an epoxy molding compound (EMC), to a single module in which the semiconductor chip has been connected to lead frames via clips or bonding wires.

In such semiconductor chip packages, the heat generated in semiconductor chips mounted inside bodies is dissipated via separate heat slugs. However, large-scale integrated semiconductor chip packages generate large amounts of heat, and thus it is difficult to expect the sufficient dissipation of heat via heat slugs.

Relates technologies proposed to improve a heat dissipation effect are described as follows:

1. Korean Patent No. 10-0648509 (entitled "Tape-type Lead Frame Strip and Lead Exposure-type Semiconductor Chip Package and Manufacturing Method using Same") discloses a technology including: a semiconductor chip provided with bonding pads; pattern leads connected to the bonding pads via wires; and a package body configured to encapsulate the semiconductors chip, the wires, and the pattern leads, and formed such that the bottom surface of the semiconductor chip and the lower surfaces of the pattern lead are exposed to the outside.

This related technology is problematic in that the semiconductor chip is connected to the pattern leads by the wires, so that heat dissipation is not easily performed. In other words, the wires are attached by bonding and transfer only electrical signals and heat is not transferred to the patterns via the wires, so that it is difficult to expect high heat dissipation.

2. Korean Patent No. 10-1461197 (entitled "COF-type Semiconductor Chip Package having Heat dissipating structure) discloses a technology including: a first heat dissipating resin layer applied between a semiconductor chip and a film; and a second heat dissipating resin layer applied to the film so that the second heat dissipating resin layer comes into contact with the side surface of the semiconductor chip and the upper surface of the semiconductor chip is exposed to the outside.

This related technology is problematic in that the semiconductor chip is disposed on the film and is connected to electrode patterns by bumps, so that the heat generated in the semiconductor chip is dissipated via only an exposed upper portion and heat dissipation is not easily performed in a downward direction in which the film is attached. Furthermore, this related technology is problematic in that there is no package body configured to protect the semiconductor chip and individual components, so that it is difficult to perform connection via lead frames or wires and the package may be easily damaged by vibration or impact.

3. Korean Patent Application Publication No. 10-2005-0051806 (entitled "Semiconductor Chip Package") discloses a technology including: a semiconductor chip; a substrate configured such that bonding pads configured to perform electrical connection to the semiconductor chip are provided on an insulation material and solder balls configured to perform electrical connection to the outside are provided on the lower surface of the insulation material; bonding wires configured to electrically connect the semiconductor chip with the bonding pads; an encapsulation material configured to seal the semiconductor chip; and a heat shield interposed between the insulation material and the semiconductor chip.

This related technology is also configured such that the semiconductor chip is mounted on the substrate. The bonding pads and the semiconductor chip provided on the upper surface of the substrate are connected to each other by the wires, and the wires are attached by bonding and transfer only electrical signals. Heat is not transferred to patterns via the wires, so that it is difficult to expect high heat dissipation from this technology.

SUMMARY

The present invention has been conceived to overcome the above-described problems, and an object of the present invention is to provide a semiconductor chip package having a heat dissipating structure, which is provided with a heat dissipating structure configured to effectively dissipate the heat generated chiefly in a semiconductor chip, thereby preventing the chip from being erroneously operated and damaged due to excessive heating, and which is configured such that the semiconductor chip and lead frames can be effectively protected by a package body, thereby improving durability.

According to an aspect of the present invention, there is provided a semiconductor chip package having a heat dissipating structure, the semiconductor chip package including: a semiconductor chip configured such that a plurality of terminals protrudes from the upper surface thereof; lead frames connected to the terminals located on the upper surface of the semiconductor chip; and a package body configured to protect the semiconductor chip and the lead frames and to form the outside shape of the semiconductor chip package, and formed by molding; wherein the lower surfaces of the lead frames are exposed to the outside; and wherein the lower surface of the package body is partially cut out such that the bottom surface of the semiconductor chip is exposed to the outside.

The bottom surface of the semiconductor chip may be disposed at a height spaced apart from the lower surface of the package body, and a cutout hole may be formed in the package body up to the height so that the bottom surface of the semiconductor chip is exposed to the outside.

The cutout hole may be filled with a conductive or non-conductive filling material so that heat dissipation is performed via the filling material.

The filling material may include a non-conductive material including one or more of silica, alumina, and aluminum nitride, or may include a conductive material including a metallic powder including one or more of silver, and copper.

One of upper surfaces of the lead frames may be exposed via the upper surface of the package body.

A heat sink plate may be attached to the upper surfaces of the lead frames, and one surface of the heat sink plate may be exposed via the upper surface of the package body, thereby enabling heat dissipation to be performed.

The heat sink plate may include: a first heat sink layer configured such that it comes into direct contact with the upper surfaces of the lead frames and one surface thereof is exposed via the upper surface of the package body; and a second heat sink layer configured to be attached to the exposed surface of the first heat sink layer and to be entirely exposed to the outside.

According to another aspect of the present invention, there is provided a semiconductor chip package having a heat dissipating structure, the semiconductor chip package including: a semiconductor chip configured such that a plurality of terminals protrudes from the upper surface thereof; lead frames indirectly connected to the terminals located on the upper surface of the semiconductor chip; a substrate directly attached to the terminals of the semiconductor chip, and configured to enable the lead frames to be indirectly connected to the terminals; and a package body configured to protect the semiconductor chip and the lead frames and to form the outside shape of the semiconductor chip package, and formed by molding; wherein the lower surfaces of the lead frames are exposed to the outside; and wherein the lower surface of the package body is partially cut out such that the bottom surface of the semiconductor chip is exposed to the outside.

The substrate may include: a lower metal configured to enable the terminals to be connected to the lead frames; an upper metal configured such that one surface thereof is exposed via the upper surface of the package body, thereby enabling heat dissipation to be performed; and an insulation adhesive provided between the lower metal and the upper metal, and configured to enable heat transfer between the lower metal and the upper metal.

The upper surfaces of the lead frames may be disposed flush with the upper surfaces of the terminals.

According to still another aspect of the present invention, there is provided a semiconductor chip package having a heat dissipating structure, the semiconductor chip package including: a semiconductor chip configured such that a plurality of terminals protrudes from a lower surface thereof and terminals are not formed on the bottom surface thereof opposite to the lower surface; lead frames connected to the terminals of the semiconductor chip; and a package body configured to protect the semiconductor chip and the lead frames and to form the outside shape of the semiconductor chip package, and formed by molding; wherein the package body is partially cut out such that the bottom surface of the semiconductor chip is exposed to the outside; wherein the terminals are connected to the lead frames in the state in which the terminals of the semiconductor chip have been located in a lower portion of the package body; and wherein the bottom surface of the semiconductor chip is exposed via the upper surface of the package body.

The lead frames may be formed in a non-bent shape, and the terminals of the semiconductor chip may be disposed at locations in contact with the upper surfaces of the lead frames and connected to the lead frames.

The exposed surface of the semiconductor chip may be disposed at a location lower than the upper surface of the package body, and a cutout hole may be formed up to the location so that the exposed surface of the semiconductor chip is exposed to the outside via the cutout hole.

The cutout hole may be filled with a conductive or non-conductive filling material so that heat dissipation is performed via the filling material.

The filling material may include a non-conductive material including one or more of silica, alumina, and aluminum nitride, or may include a conductive material including a metallic powder including one or more of silver, and copper.

According to still another aspect of the present invention, there is provided a semiconductor chip package having a heat dissipating structure, the semiconductor chip package including: a semiconductor chip configured such that a plurality of terminals protrudes from the lower surface thereof and terminals are not formed on the bottom surface thereof opposite to the lower surface; lead frames indirectly connected to the terminals of the semiconductor chip; clip members each disposed between the semiconductor chip and one of the lead frames, and configured to enable the terminals to be indirectly connected to the lead frames; and a package body configured to protect the semiconductor chip, the lead frames, and the clip members and to form the outside shape of the semiconductor chip package, and formed by molding; wherein the package body is partially cut out such that the bottom surface of the semiconductor chip is exposed to an outside; wherein the terminals are connected to the lead frames in the state in which the terminals of the semiconductor chip have been oriented toward a lower surface of the package body; and wherein the bottom surface of the semiconductor chip is exposed via the upper surface of the package body.

The lead frames may be formed in a non-bent state and disposed at locations lower than the terminals of the semiconductor chip, and the clip members connected to the lead frames may be bent upward to the locations of the terminals and connected to the terminals.

According to still another aspect of the present invention, there is provided a semiconductor chip package having a heat dissipating structure, the semiconductor chip package including: a semiconductor chip configured such that a plurality of terminals protrudes from the upper surface thereof and terminals are not formed on a bottom surface thereof opposite to the upper surface; lead frames indirectly connected to the terminals of the semiconductor chip; clip members each disposed between the semiconductor chip and one of the lead frames, and configured to enable the terminals to be indirectly connected to the lead frames; and a package body configured to protect the semiconductor chip, the lead frames, and the clip members and to form the outside shape of the semiconductor chip package, and formed by molding; wherein the package body is partially cut out such that the bottom surface of the semiconductor chip is exposed to an outside; wherein the terminals are connected to the lead frames in the state in which the terminals of the semiconductor chip have been oriented toward the upper surface of the package body; and wherein the bottom surface of the semiconductor chip is exposed via the lower surface of the package body.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Preferred embodiments of the present invention will be described in detail with reference to the accompanying drawings below. In the following description of the present invention, a detailed description of a related well-known function or configuration will be omitted when it is determined that the detailed description may unnecessarily make the gist of the present invention obscure.

In the following description of the preferred embodiments of the present invention, there will be sequentially described structures in which the bottom surface of a semiconductor chip is exposed downward, i.e., toward a PCB substrate basically mounted underneath a package, structures in which the bottom surface of a semiconductor chip is exposed upward, i.e., toward a side opposite to a PCB substrate, and structures in which clip members are used as conductive members.

First, a structure in which the bottom surface of a semiconductor chip is exposed downward, i.e., toward a base PCB substrate, is described.

According to the present invention, there is provided a semiconductor chip package having a heat dissipating structure, the semiconductor chip package including: a semiconductor chip 10 configured such that a plurality of terminals 11 protrudes from the upper surface thereof; lead frames 20 directly connected to the terminals 11 located on the upper surface of the semiconductor chip 10; and a package body 30 configured to protect the semiconductor chip 10 and the lead frames 20 and to form the outside shape of the semiconductor chip package, and formed by molding; wherein the lower portions of the lead frames 20 are exposed to the outside; and wherein the lower surface of the package body 30 is partially cut out such that the bottom surface of the semiconductor chip 10 is exposed to the outside.

Figure 1:
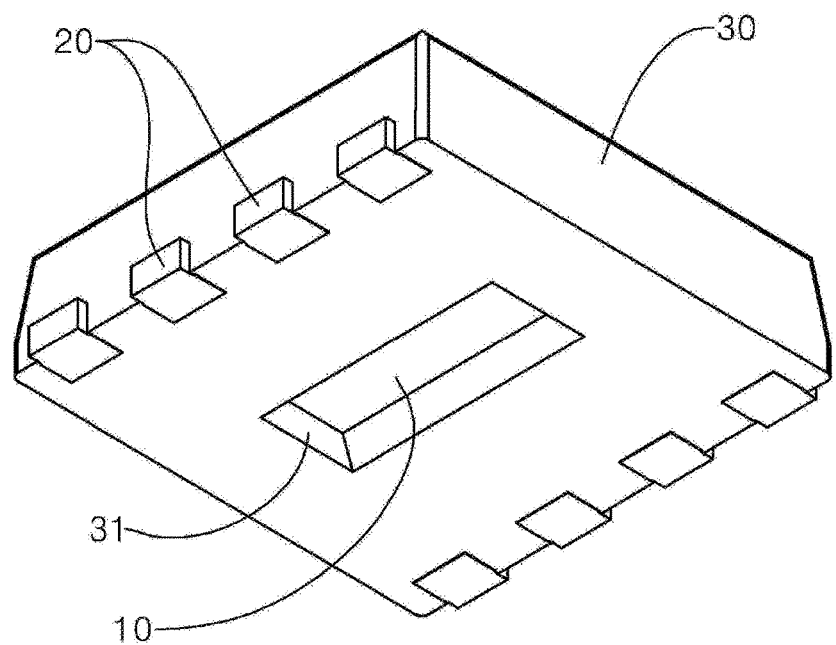
FIG. 1 is a perspective view showing the bottom surface of a semiconductor chip package having a heat dissipating structure according to the present invention.

According to the present invention, a heat dissipation effect may be increased by enabling the bottom surface of the semiconductor chip 10 to be exposed via the lower surface of the package body 30. Accordingly, the bottom surface of the semiconductor chip 10 may be exposed downward in such a manner that the bottom surface of the semiconductor chip 10 is located flush with the lower surface of the package body 30. Alternatively, the bottom surface of the semiconductor chip 10 may be exposed to the outside in such a manner that the bottom surface of the semiconductor chip 10 is disposed at a height spaced apart from the lower surface of the package body 30 and a cutout hole 31 is formed up to the height, as shown in FIG. 1.

In the case where the cutout hole 31 is formed up to the semiconductor chip 10 at a location spaced apart from the lower surface of the package body 30 as described above, when a corresponding semiconductor chip package is mounted on a board (not shown), the semiconductor chip 10 is spaced apart from the lower surface, thereby preventing the erroneous operation of the semiconductor chip 10 attributable to electrical noise. Furthermore, the cutout hole 31 is preferably shaped in a form widening from the upper surface thereof to the lower surface thereof in order to further increase heat dissipation efficiency.

Furthermore, in the case where the cutout hole 31 is filled with a conductive or non-conductive filling material 40, heat dissipation may be performed via the filling material 40. In other words, the filling material 40 may include a non-conductive material including one or more of silica $SIO_2$, alumina $Al_2O_3$, and aluminum nitride AlN, or may include a conductive material including a metallic powder including one or more of silver Ag, and copper Cu.

The cutout hole 31 is filled with the filling material 40 by using a method of dispensing a material in a paste state or by using a screen mask, and then the filling material 40 is completed by a hardening process. The filling material 40 formed as described above serves to perform heat dissipation and also to facilitate soldering in a portion where the lower surface of the filling material 40 and the board come into contact with each other when the semiconductor chip package is mounted on the board.

The plurality of terminals 11 protrudes from the upper surface of the semiconductor chip 10 according to the present invention, and the lead frames 20 are directly or indirectly connected to the terminals 11 in order to enable heat transfer to be performed via the lead frames 20, thereby enabling heat dissipation to be performed via both the upper and lower surfaces of the semiconductor chip 10.

In connection with the structure in which the bottom surface of the semiconductor chip 10 is exposed downward, i.e., toward the substrate, the following structure may be provided.

Figure 2:
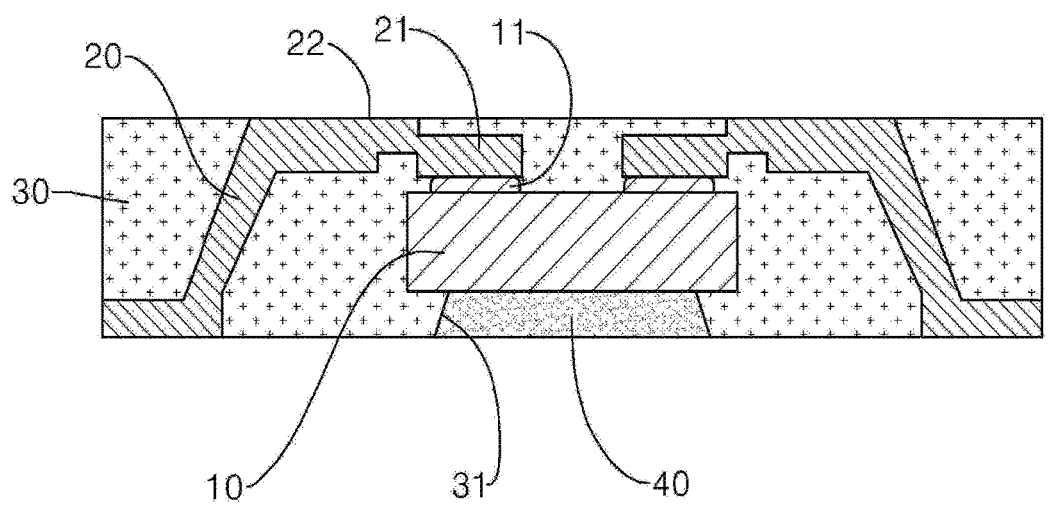
FIG. 2 is a sectional view showing a semiconductor chip package having a heat dissipating structure according to an embodiment of the present invention.

In FIG. 2, there is shown a semiconductor chip package having a heat dissipating structure according to an embodiment of the present invention, the semiconductor chip package including: a semiconductor chip 10 configured such that a plurality of terminals 11 protrudes from the upper surface thereof; lead frames 20 directly connected to the terminals 11 of the semiconductor chip 10; and a package body 30 configured to protect the semiconductor chip 10 and the lead frames 20 and to form the outside shape of the semiconductor chip package, and formed by molding; wherein the lower surfaces of the lead frames 20 are exposed to the outside; wherein the lower surface of the package body 30 is partially cut out such that the bottom surface of the semiconductor chip 10 is exposed to the outside; and wherein the upper surfaces of the lead frames 20 are exposed via the upper surface of the package body 30, thereby enabling heat dissipation to be performed.

Figure 3:
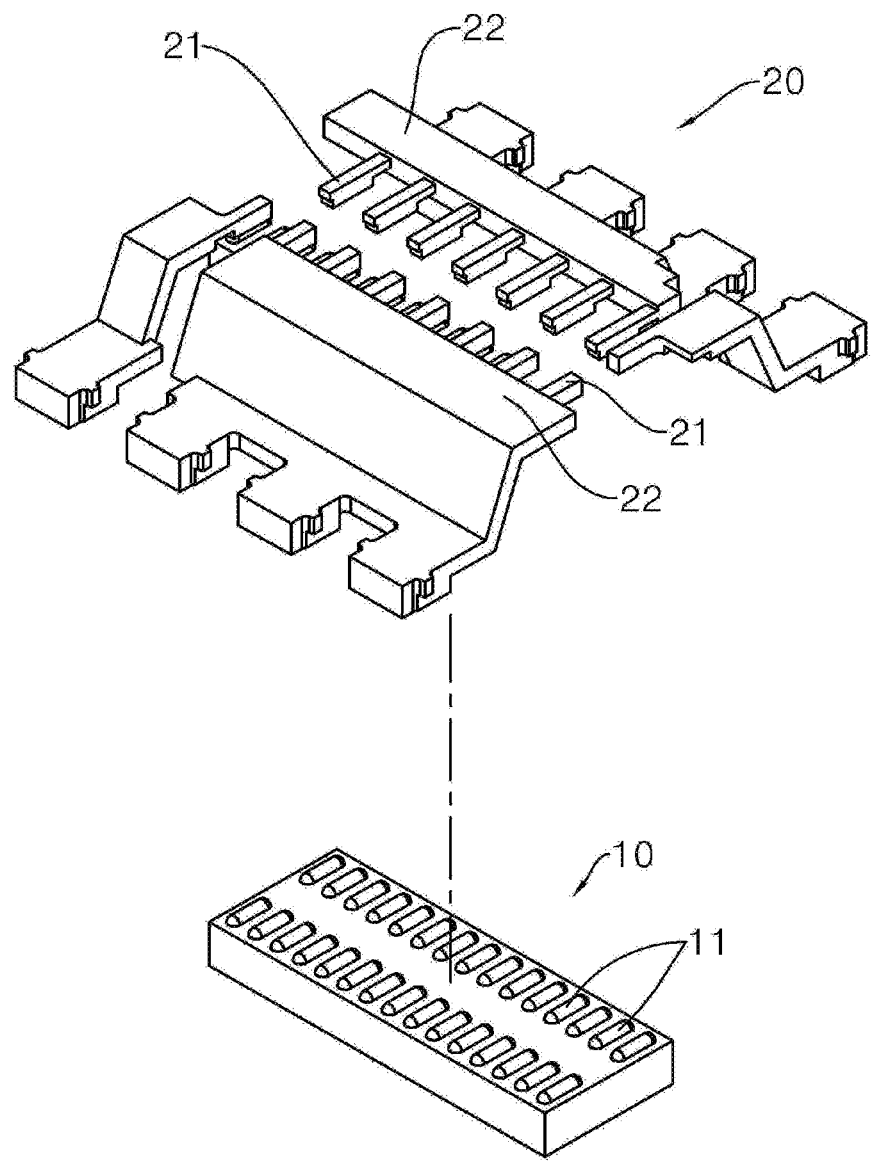
FIG. 3 is an exploded perspective view showing the internal configuration of the semiconductor chip package shown in FIG. 2.

As shown in FIG. 2, the upper surfaces of the lead frames 20 are disposed flush with the upper surface of the package body 30 and exposed to the outside. As shown in FIG. 3, the plurality of protrusions 21 formed on the lead frames 20 comes into contact with the terminals 11 of the semiconductor chip 10 and receives heat, and the received heat is collected in upper plate portions 22 corresponding to the upper surfaces of the lead frames 20 and dissipated via the exposed upper surfaces. Furthermore, as shown in the drawing, both left and right lead frames 20 may be exposed by making the heights of the upper plate portions 22 of the left and right lead frames 20 identical with each other, or only one of the lead frames 20 may be exposed by making the heights of the upper plate portions 22 of the left and right lead frames 20 different from each other.

Figure 4:
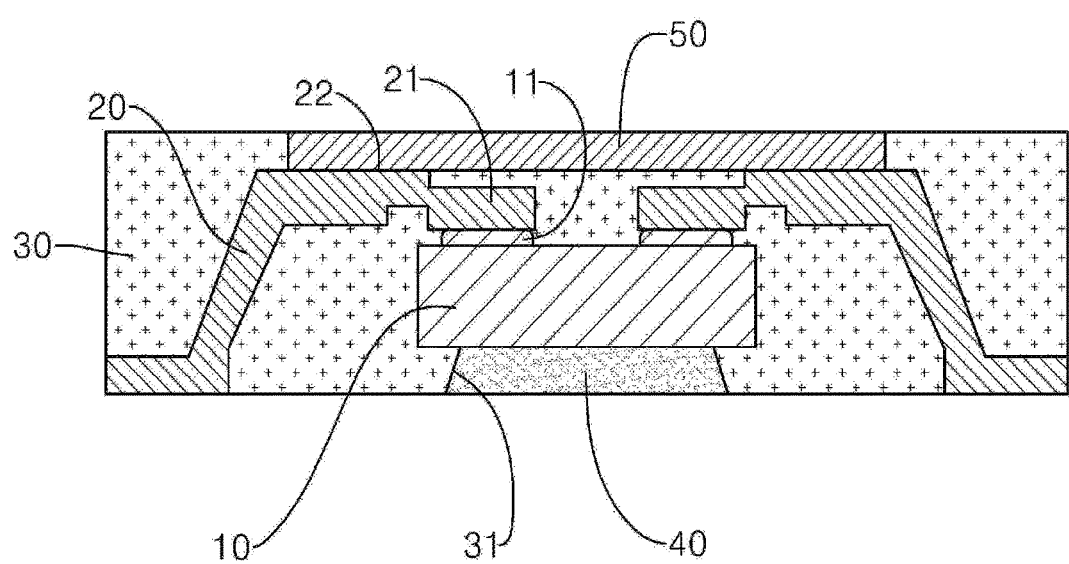
FIG. 4 is a sectional view showing a semiconductor chip package having a heat dissipating structure according to another embodiment of the present invention.
Figure 5:
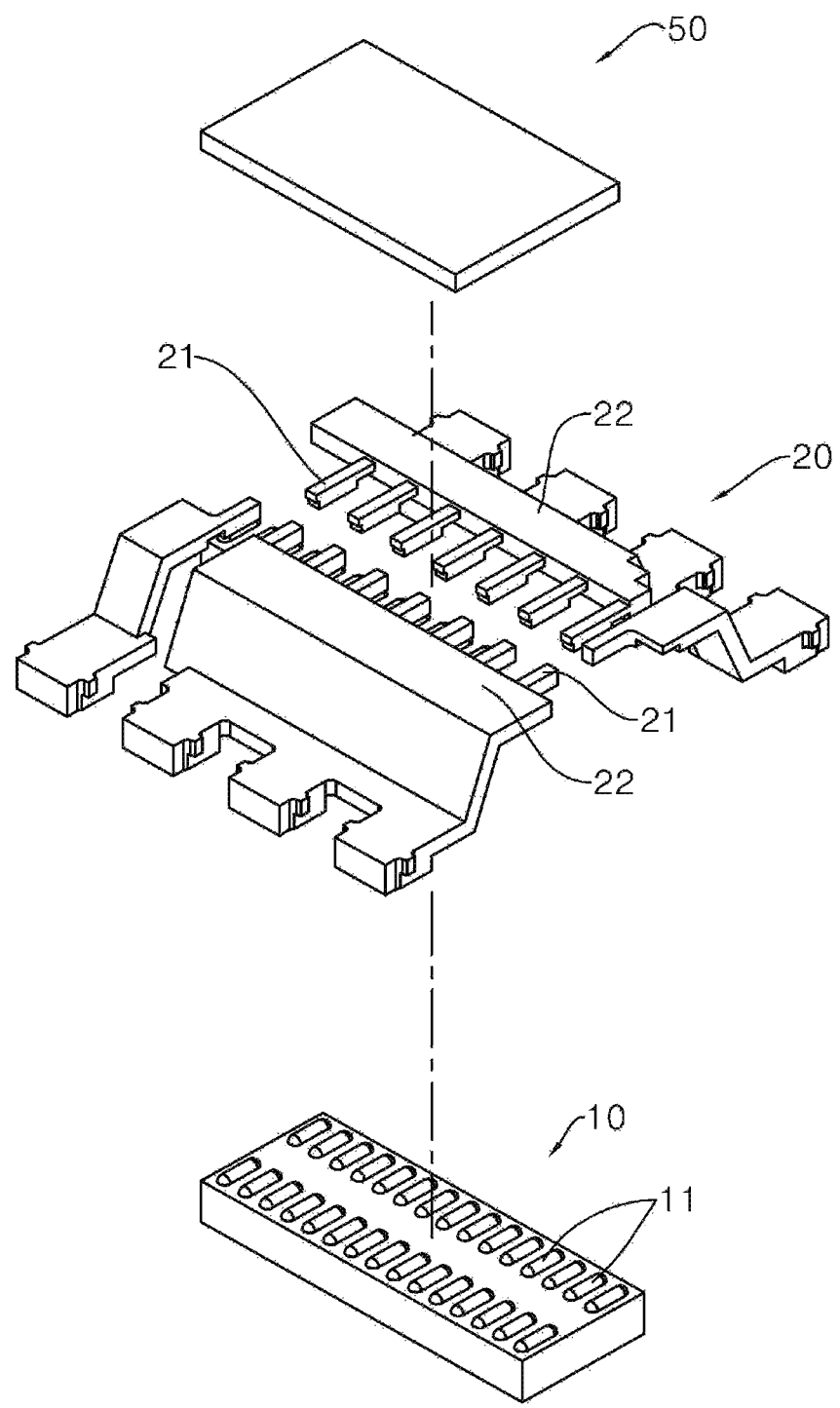
FIG. 5 is an exploded perspective view showing the internal configuration of the semiconductor chip package shown in FIG. 4.

In FIG. 4, there is shown a semiconductor chip package having a heat dissipating structure according to another embodiment of the present invention, the semiconductor chip package including: a semiconductor chip 10 configured such that a plurality of terminals 11 protrudes from the upper surface thereof; lead frames 20 directly connected to the terminals 11 of the semiconductor chip 10; and a package body 30 configured to protect the semiconductor chip 10 and the lead frames 20 and to form the outside shape of the semiconductor chip package, and formed by molding; wherein the lower portions of the lead frames 20 are exposed to the outside; wherein the lower surface of the package body 30 is partially cut out such that the bottom surface of the semiconductor chip 10 is exposed to the outside; and wherein a heat sink plate 50 is attached to the upper surfaces of the lead frames 20 and one surface of the heat sink plate 50 is exposed via the upper surface of the package body 30, thereby enabling heat dissipation to be performed.

In FIG. 4, the lead frames 20 are not exposed upward, but the attached heat sink plate 50 is exposed upward. The material of the heat sink plate 50 may be a non-conductive material, such as ceramic, or a conductive material including a metallic component depending on whether the heat sink plate 50 is attached to both or any one of the left and right lead frames 20. In other words, when the heights of the upper plate portions 22 of the left and right lead frames 20 are made different from each other and the heat sink plate 50 is attached to only any one of the lead frames 20, the material of the heat sink plate 50 may be a conductive material. In contrast, when the heights of the upper plate portions 22 of the left and right lead frames 20 are made identical with each other and the heat sink plate 50 is attached to both of the lead frames 20, the material of the heat sink plate 50 may be a non-conductive material.

Furthermore, the heat sink plate 50 is attached using an ultrasonic welding method or a conductive or non-conductive adhesive. The ultrasonic welding method is designed to perform attachment via a separate ultrasonic welding device (not shown), and performs pressure welding by generating vibration friction heat by means of pressure ultrasonic vibrations while applying a static load to the surface of an attachment target material. The attachment is performed using the ultrasonic welding method, and thus effects can be achieved in that attachment quality can be improved, the generation of an environment contaminating material can be prevented, and manufacturing efficiency can be improved by automatic control.

Figure 6:
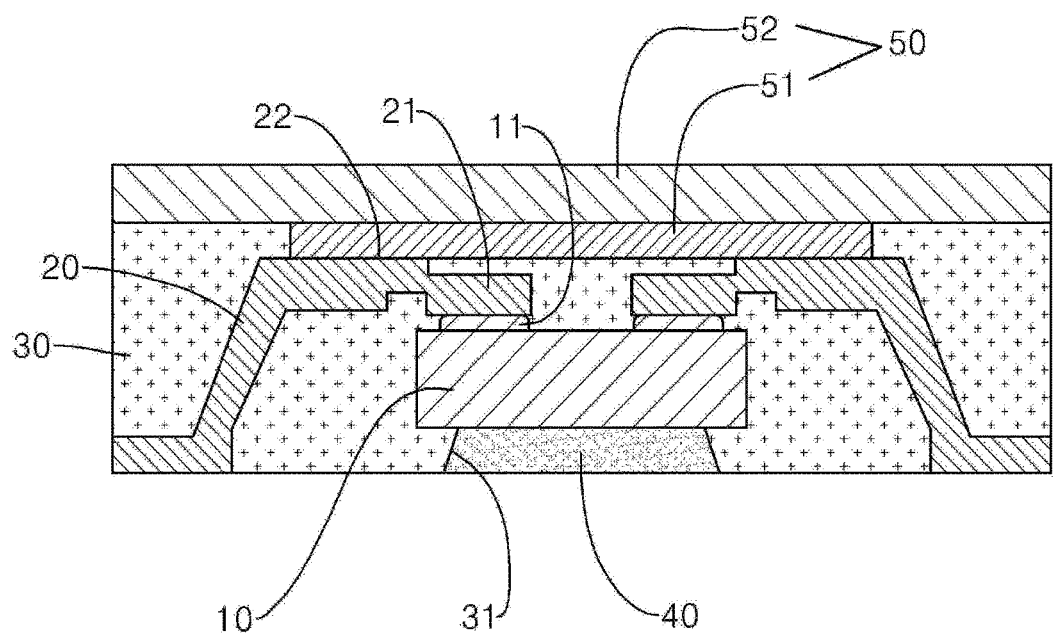
FIG. 6 is a sectional view showing a semiconductor chip package having a heat dissipating structure according to still another embodiment of the present invention.
Figure 7:
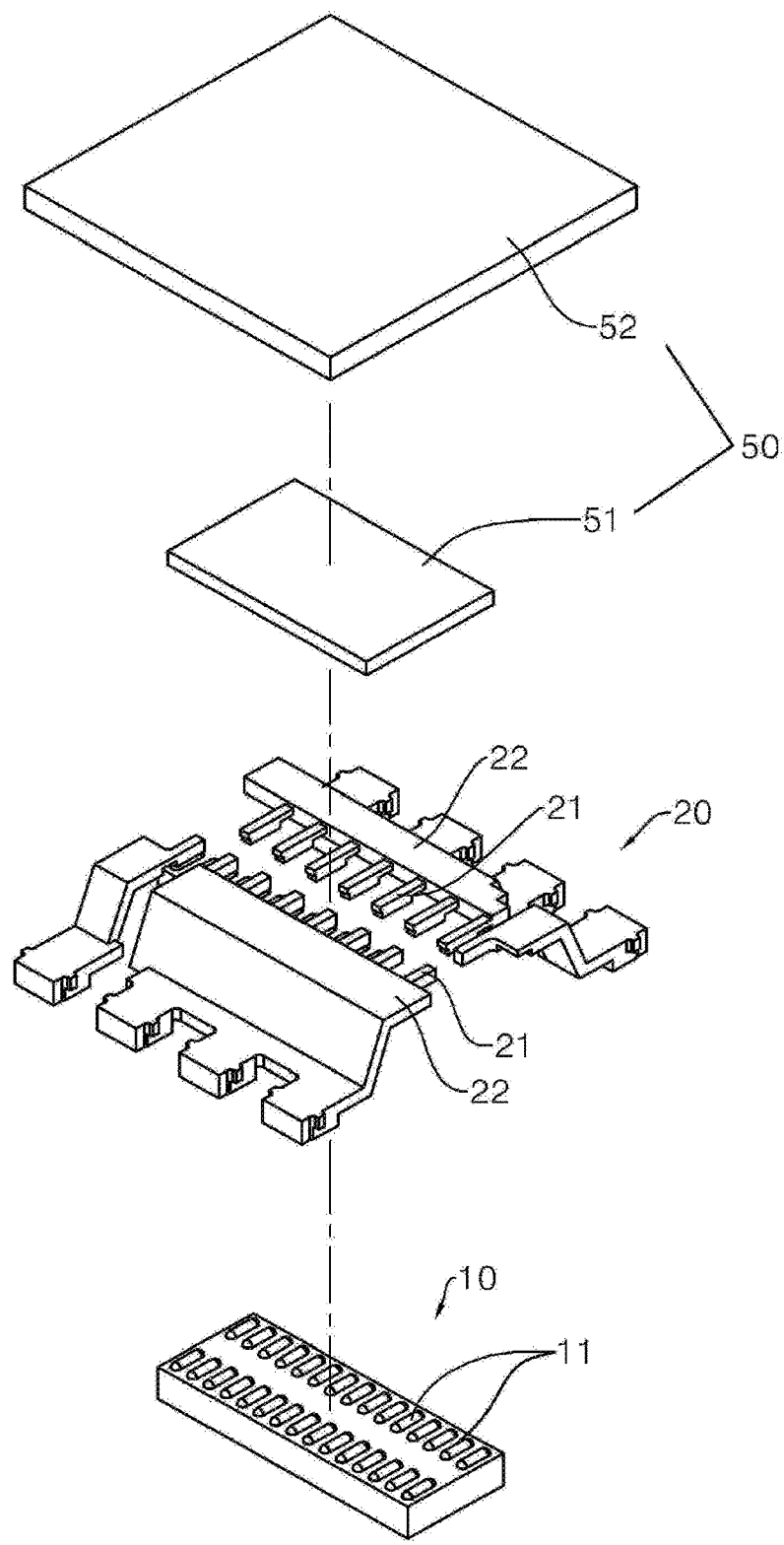
FIG. 7 is an exploded perspective view showing the internal configuration of the semiconductor chip package shown in FIG. 6.

FIG. 6 shows a structure in which the configuration of the heat sink plate 50 has been changed in the structure shown in FIG. 4. In other words, the configuration of the heat sink plate 50 shown in FIG. 6 includes: a first heat sink layer 51 configured such that the first heat sink layer 51 comes into direct contact with the upper surface of the lead frame 20 and one surface of the first heat sink layer 51 is exposed via the upper surface of the package body 30; and a second heat sink layer 52 attached to the exposed surface of the first heat sink layer 51 and entirely exposed to the outside.

The first heat sink layer 51 is configured such that all the surfaces thereof except for the upper surface thereof, i.e., the lower and side surfaces thereof, are surrounded by the package body 30. In contrast, the second heat sink layer 52 has an area larger than that of the first heat sink layer 51, and is configured such that all the surfaces thereof except for the attached surface thereof are exposed to the outside. Accordingly, this structure is more complex than that of FIG. 4, but can further improve heat dissipation efficiency.

Figure 8:
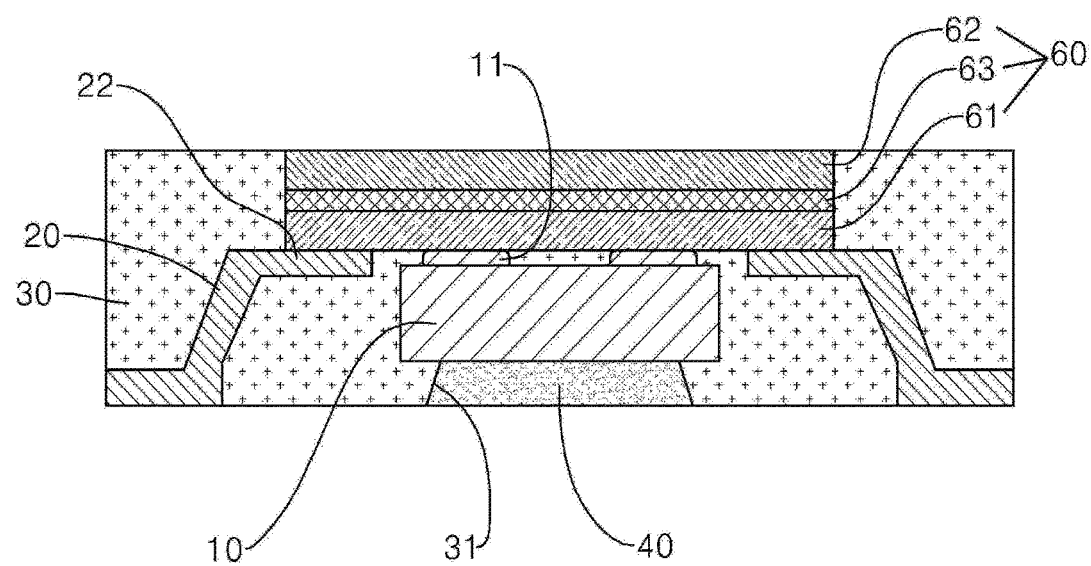
FIG. 8 is a sectional view showing a semiconductor chip package having a heat dissipating structure according to still another embodiment of the present invention.
Figure 9:
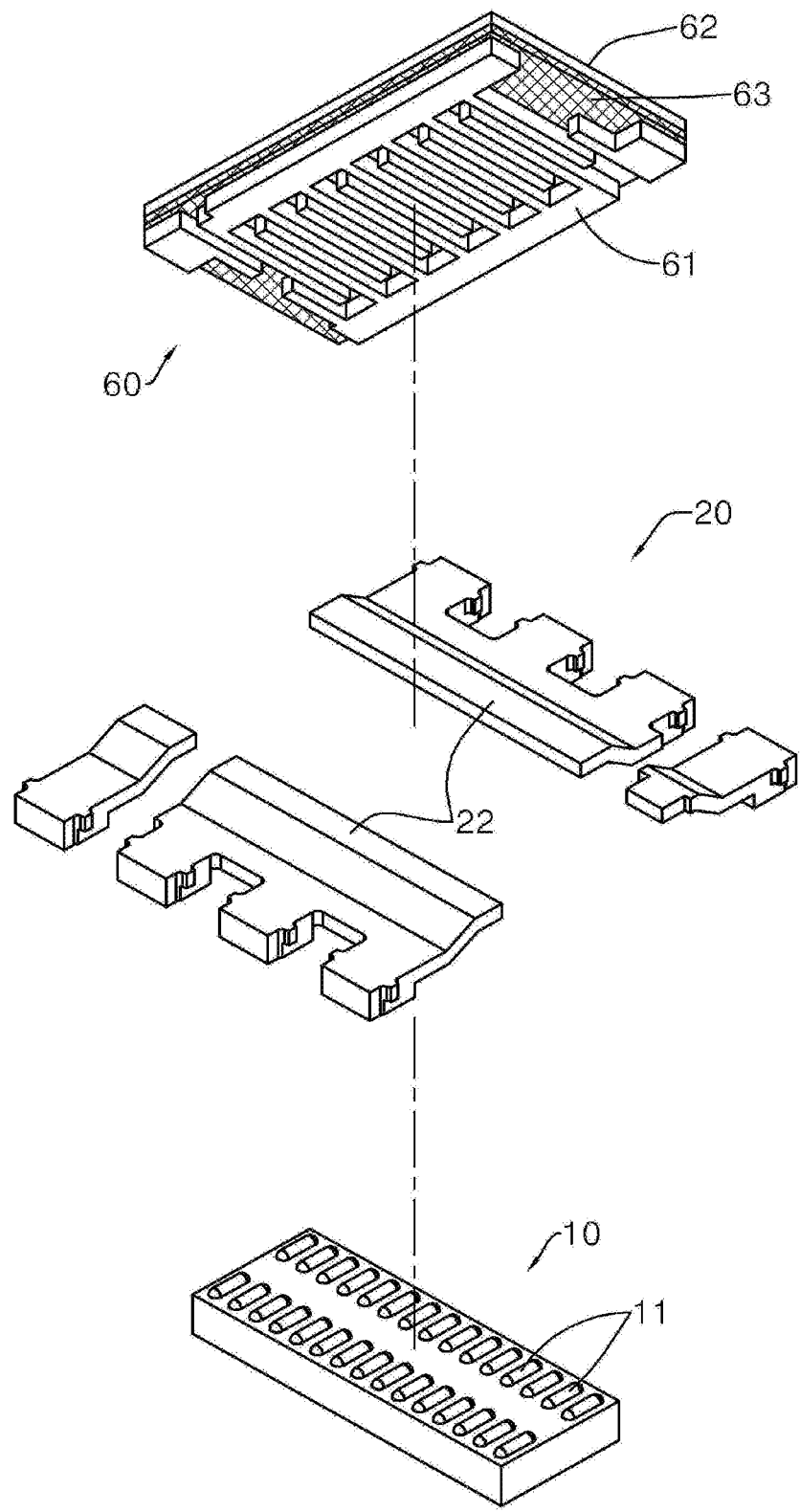
FIG. 9 is an exploded perspective view showing the internal configuration of the semiconductor chip package shown in FIG. 8.

In FIG. 8, there is shown a semiconductor chip package having a heat dissipating structure according to still another embodiment of the present invention, the semiconductor chip package including: a semiconductor chip 10 configured such that a plurality of terminals 11 protrudes from the upper surface thereof; lead frames 20 connected to the terminals 11 located on the upper surface of the semiconductor chip 10; a substrate 60 directly attached to the terminals 11 of the semiconductor chip 10 so that the lead frames 20 and the terminals 11 are indirectly connected to each other; and a package body 30 configured to protect the semiconductor chip 10 and the lead frames 20 and to form the outside shape of the structure, and formed by molding; wherein the lower portions of the lead frames 20 are exposed to the outside; wherein the package body 30 is partially cut out such that the bottom surface of the semiconductor chip 10 can be exposed to the outside; and wherein the upper surface of the substrate 60 is exposed to the outside, thereby enabling heat dissipation to be performed.

As shown in FIG. 8, protrusions are not formed on the lead frames 20, and thus the lead frames 20 are not directly attached to the terminals 11 of the semiconductor chip 10. In other words, the substrate 60 is placed on the upper plate portions 22 of the lead frames 20, and thus the lead frames 20 are indirectly connected to the terminals 11 of the semiconductor chip 10. Accordingly, upper surfaces corresponding to the upper plate portions 22 of the lead frames 20 have to be disposed flush with the upper surfaces of the terminals 11.

Furthermore, the substrate 60 includes: a lower metal 61 formed in a pattern shape, and configured to enable the terminals 11 to be connected to the lead frames 20; an upper metal 62 configured such that one surface thereof is exposed via the upper surface of the package body 30, thereby enabling heat dissipation to be performed; and an insulation adhesive 63 provided between the lower metal 61 and the upper metal 62, and configured to enable heat transfer between the lower metal 61 and the upper metal 62.

The lower metal 61 is formed in a pattern shape, and enables the terminals 11 and the lead frames 20 to be electrically connected to each other. The upper metal 62 is configured such that one surface thereof is exposed, thereby performing a heat dissipation function. Furthermore, the lower metal 61 and the upper metal 62 are attached to each other by the insulation adhesive 63 in the state in which a short circuit can be prevented from occurring between the lower metal 61 and the upper metal 62.

The heat dissipating structure using the substrate 60 is suitable for a complex semiconductor chip, and is useful for the condition in which lead frames cannot be directly connected.

Next, a structure in which the bottom surface of a semiconductor chip is exposed upward is described.

Figure 10:
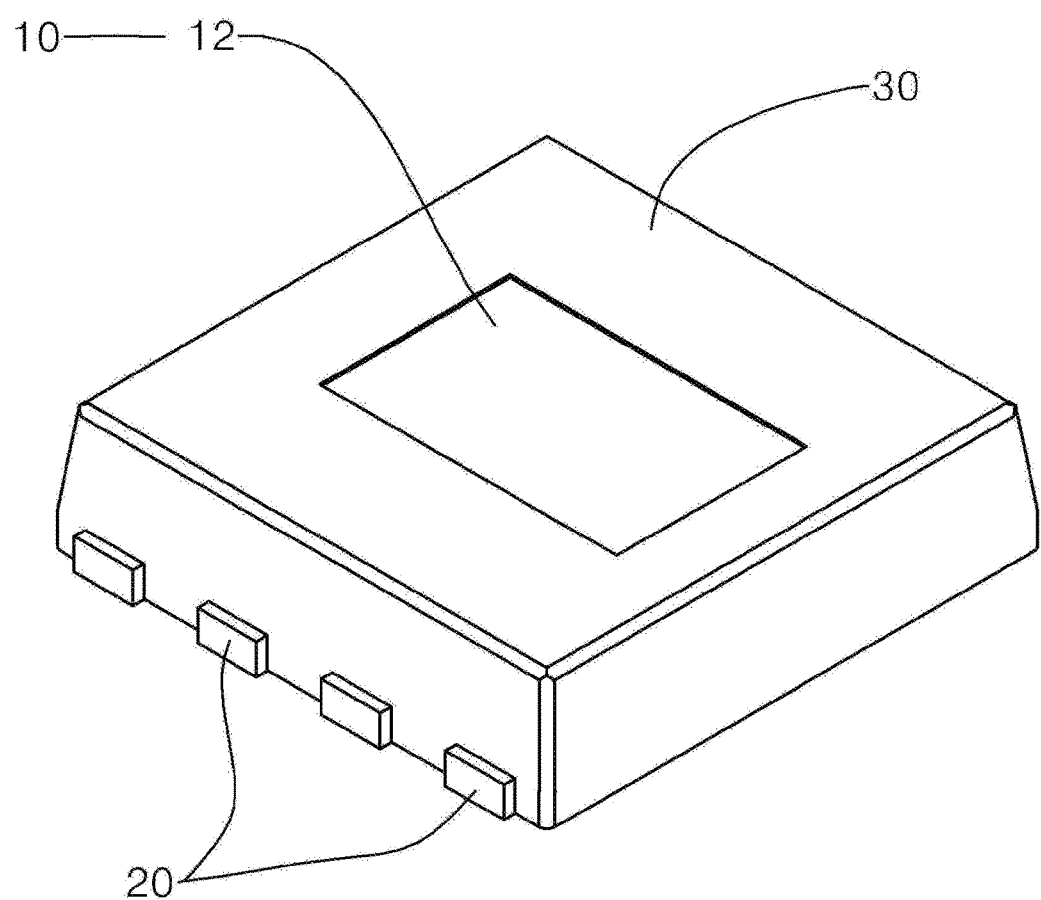
FIG. 10 is a perspective view showing a semiconductor chip package according to still another embodiment of the present invention.
Figure 11:
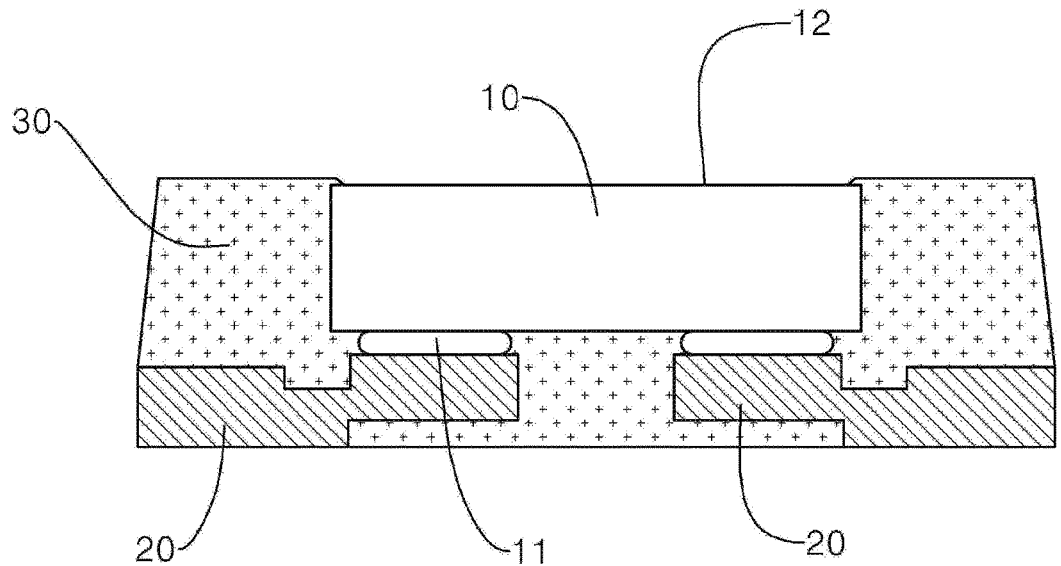
FIG. 11 is a sectional view showing the internal configuration of the semiconductor chip package shown in FIG. 10.

In FIGS. 10 and 11, there is shown a semiconductor chip package having a heat dissipating structure according to still another embodiment of the present invention, the semiconductor chip package including: a semiconductor chip 10 configured such that a plurality of terminals 11 protrudes from the lower surface thereof and terminals 11 are not formed on a bottom surface 12 opposite to the lower surface; lead frames 20 directly connected to the terminals 11 of the semiconductor chip 10; and a package body 30 configured to protect the semiconductor chip 10 and the lead frames 20 and to form the outside shape of the semiconductor chip package, and formed by molding; wherein the package body 30 is partially cut out such that the bottom surface 12 of the semiconductor chip 10 is exposed to the outside; and wherein the bottom surface 12 of the semiconductor chip 10 is exposed via the upper surface of the package body 30 by connecting the terminals 11 to the lead frames 20 in the state in which the terminals 11 of the semiconductor chip 10 have been located in the lower portion of the package body 30.

The semiconductor chip package having an improved heat dissipating structure according to the present embodiment is configured such that the bottom surface 12 of the semiconductor chip 10 on which the terminals 11 are not formed is exposed to the outside of the package body 30 and the exposed portion is exposed upward, not downward (to the direction opposite to the direction of the PCB substrate), and thus the heat generated in the semiconductor chip 10 is dissipated in a direction in which the PCB substrate is not located. Accordingly, the embodiment of the present invention is more advantageous in terms of heat dissipation conditions than the semiconductor chip package technology having a downward heat dissipating structure. Furthermore, the semiconductor chip package according to the present embodiment has the above-described heat dissipating structure, and thus has the advantage of being combined with a separate heat dissipation means, such as a heat sink, on the upper surface thereof as desired.

The plurality of terminals 11 protrudes from the lower surface of the semiconductor chip 10, and the upper surface of the semiconductor chip 10 is the flat bottom surface 12 on which the terminals 11 are not formed. In other words, the bottom surface 12 of the semiconductor chip 10 is exposed via the upper surface of the package body 30 in the state in which the semiconductor chip 10 according to the present embodiment is invention has been set upside down. In this case, although the exposed surface of the semiconductor chip 10 may be located flush with the upper surface of the package body 30 and may be exposed, it is preferable to dispose the exposed surface slightly below the upper surface of the package body 30 in order to protect the semiconductor chip 10 and perform molding so that the package body 30 surrounds only the edges of the exposed surface of the semiconductor chip 10.

The lead frames 20 are connected to the terminals 11 of the semiconductor chip 10, and thus are electrically connected to an external configuration. Parts of the package body 30 are configured to be exposed to the outside. As shown in the drawings, the lead frames 20 are not bent, but have flat plate-shaped upper surfaces. The lead frames 20 are disposed at locations at which the terminals 11 of the semiconductor chip 10 can come into direct contact with the upper surfaces of the lead frames 20. The reason why the lead frames 20 even in a simplified shape can be easily connected to the terminals 11 is that the terminals 11 of the semiconductor chip 10 are oriented toward the lower surface of the package body 30.

Since the lead frames 20 are used without being subjected to the process of bending the lead frames 20 so that they can be connected to the terminals 11, the lead frames 20 have structural advantages in that the lead frames 20 can more easily perform heat dissipation than bent lead frames, have a firmer structure, and can improve electrical connection efficiency. The lead frames 20 can improve manufacturing efficiency via the effects of reducing the manpower required for the design of the lead frames 20 and the costs required for mechanical equipment.

Figure 12:
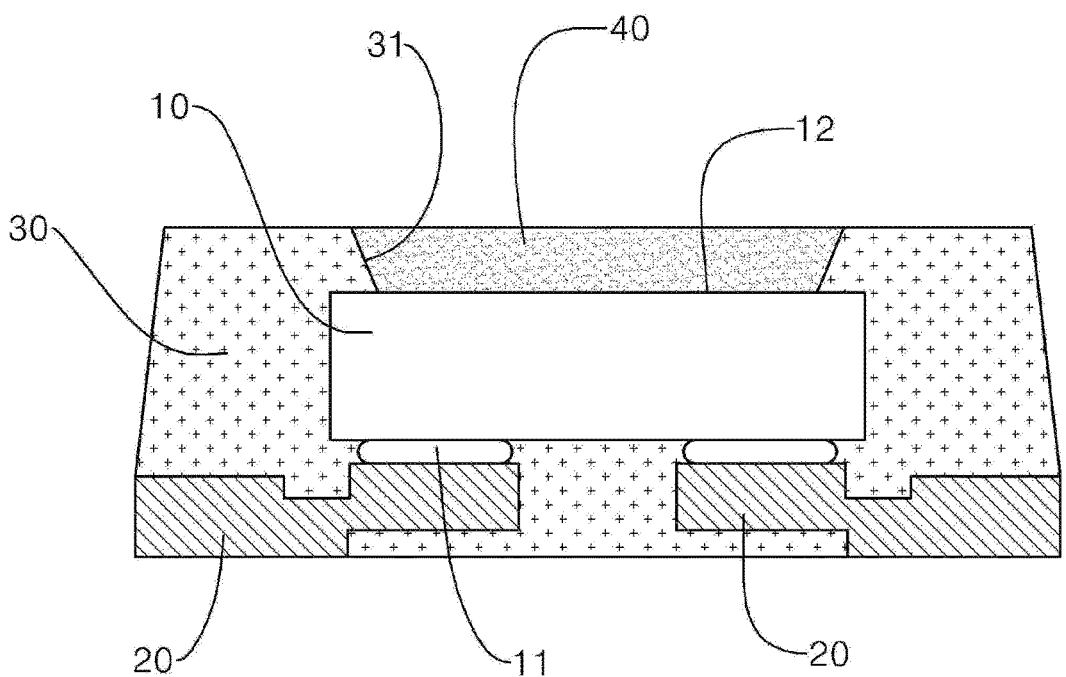
FIG. 12 is a view showing a semiconductor chip package in which a cutout hole is formed in the body of the semiconductor chip package and filled with a filling material according to still another embodiment of the present invention.

Furthermore, according to another embodiment of the present invention, as shown in FIG. 12, the exposed surface of a semiconductor chip 10 may be disposed at a location below the upper surface of a package body 30 and spaced apart from the upper surface of the package body 30, and a cutout hole 31 may be formed up to the location so that the exposed surface of the semiconductor chip 10 is exposed to the outside via the cutout hole 31. In this case, the cutout hole 31 may be filled with a conductive or non-conductive filling material 40, and thus heat dissipation may be performed via the filling material 40.

A preferred example of the material of the filling material 40 may be a non-conductive material including one or more of silica $SiO_2$, alumina $Al_2O_3$, and aluminum nitride AlN, or a conductive material including a metallic powder including one or more of silver Ag and copper Cu.

Next, a structure in which a clip member is added will be described based on the above-described embodiments of the present invention below.

Figure 13:
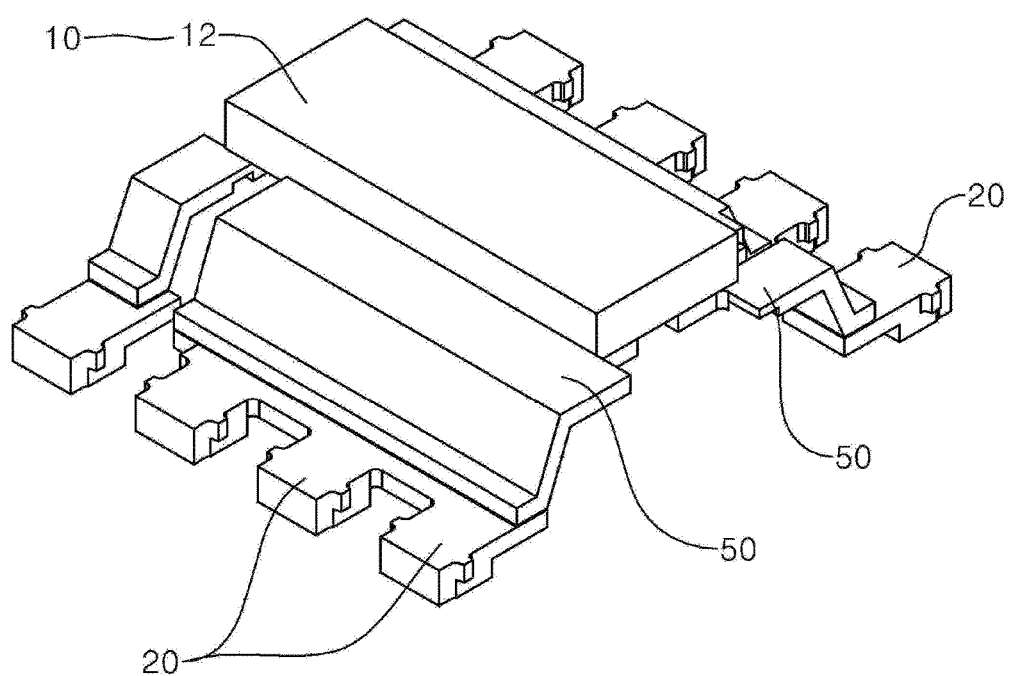
FIG. 13 is a view showing a semiconductor chip package in which clip members are disposed between the terminals and lead frames of the semiconductor chip package according to still another embodiment of the present invention.
Figure 14:
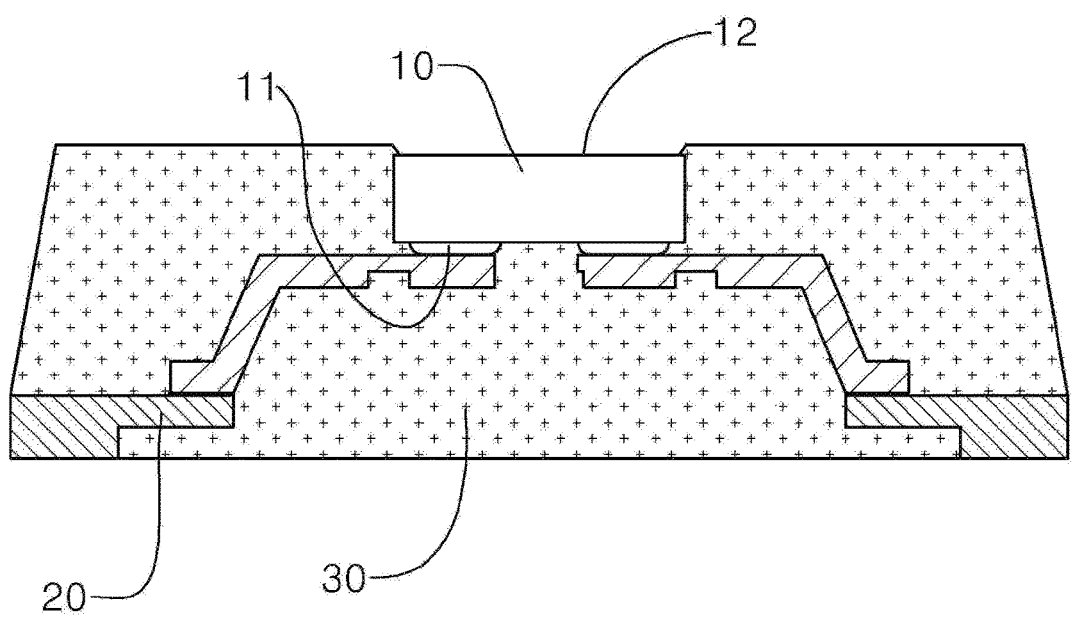
FIG. 14 is a sectional view showing the internal configuration of the semiconductor chip package shown in FIG. 13.
Figure 15:
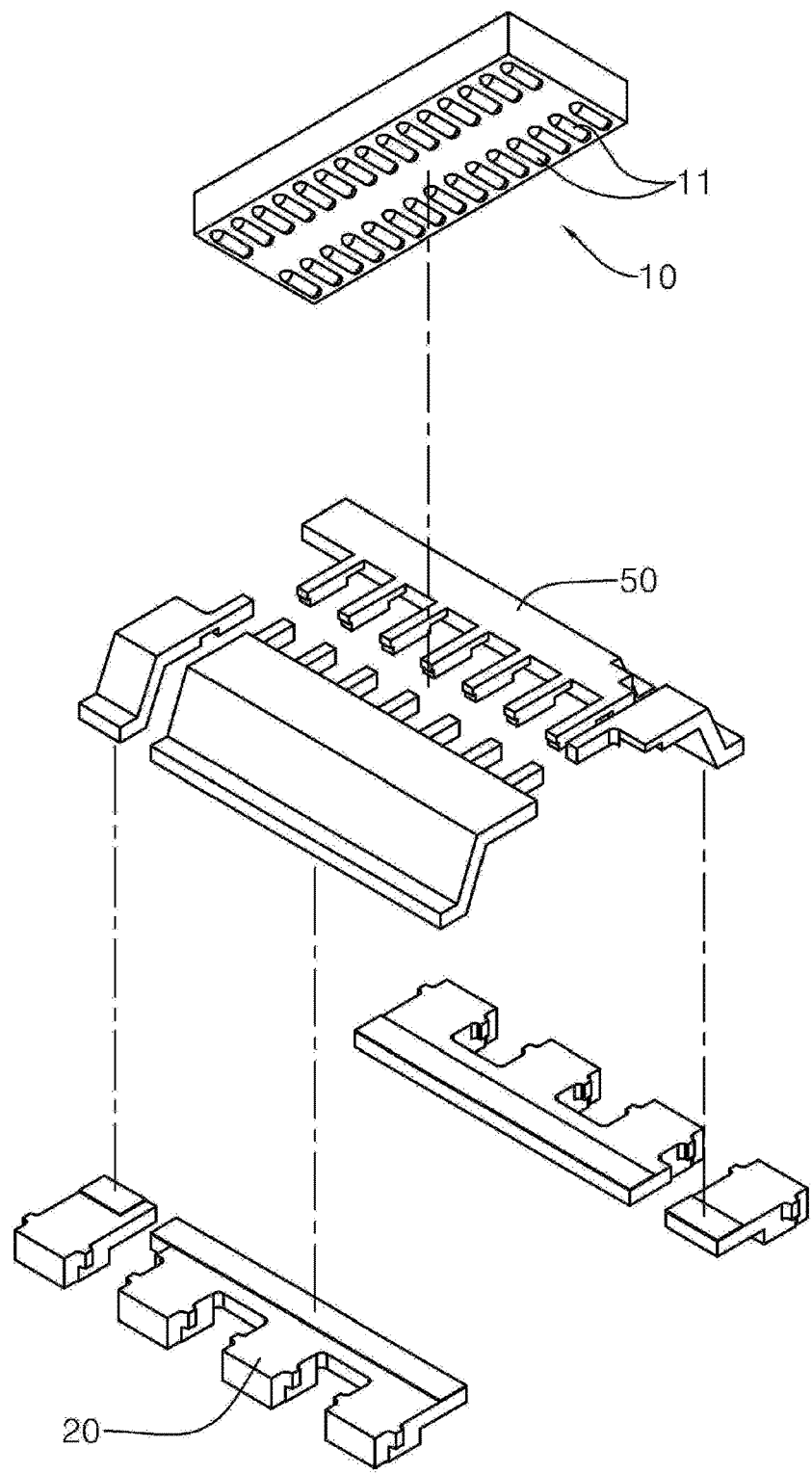
FIG. 15 is an exploded perspective view showing the internal configuration of the semiconductor chip package shown in FIG. 13.

In FIGS. 13 to 15, there is shown a semiconductor chip package having a heat dissipating structure according to still another embodiment of the present invention, the semiconductor chip package including: a semiconductor chip 10 configured such that a plurality of terminals 11 protrudes from the lower surface thereof and terminals 11 are not formed on a bottom surface 12 opposite to the lower surface; lead frames 20 connected to the terminals 11 of the semiconductor chip 10; clip members 50 each disposed between the semiconductor chip 10 and one of the lead frames 20, and configured to enable the terminals 11 to be indirectly connected to the lead frames 20; and a package body 30 configured to protect the semiconductor chip 10, the lead frames 20, and the clip members 50 and to form the outside shape of the semiconductor chip package, and formed by molding; wherein the package body 30 is partially cut out such that the bottom surface 12 of the semiconductor chip 10 is exposed to the outside; and wherein the bottom surface 12 of the semiconductor chip 10 is exposed via the upper surface of the package body 30.

In the present embodiment, the lead frames 20 are formed in a non-bent shape, and are disposed at locations lower than the terminals 11 of the semiconductor chip 10. The clip members 50 connected to the lead frames 20 are bent upward to the locations of the terminals 11, thereby enabling connection. In other words, the lower surfaces of the clip members 50 are connected to the upper surfaces of the lead frames 20, and the upper surfaces of the clip members 50 are connected to the terminals 11 located on the bottom surface of the semiconductor chip 10. In this case, the clip members 50 and the lead frames 20 are preferably connected to each other via solder or an epoxy-based electrically conductive adhesive.

In the present embodiment, the terminals 11 and the lead frames 20 are indirectly connected to each other via the clip members 50 provided between the terminals 11 of the semiconductor chip 10 and the lead frames 20. By configuring the clip members 50 as described above, various design conditions may be satisfied by using the lead frames 20 in a simplified shape, and external stress transferred to the lead frames 20 may be prevented from being directly transferred to the terminals 11, thereby achieving the effect of preventing the chip from being damaged.

Figure 16:
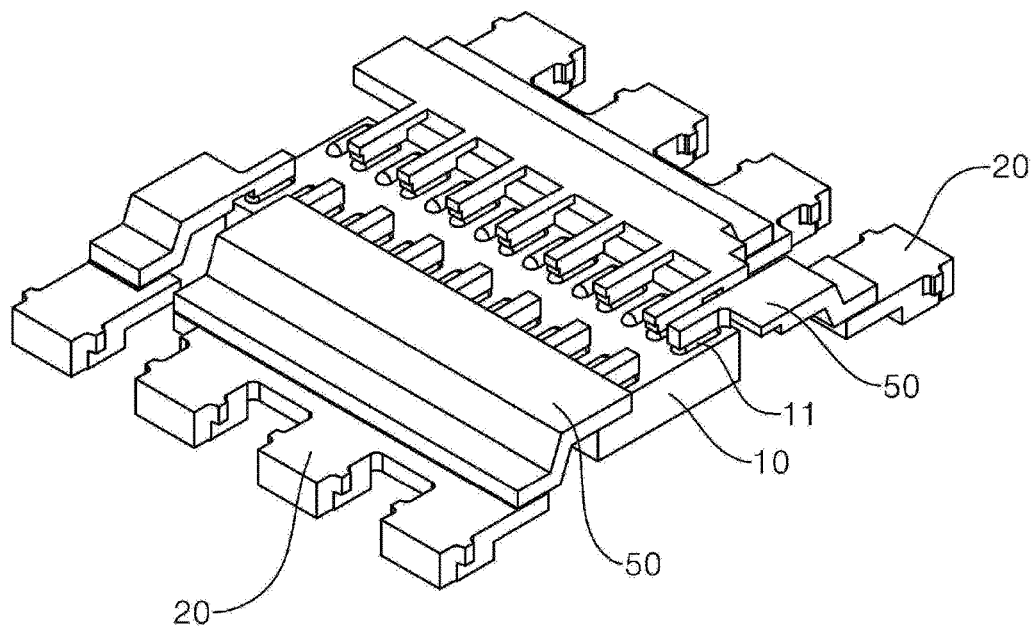
FIGS. 16 and 17 are views showing a semiconductor chip package in which clip members are used and the heat generated in a semiconductor chip is dissipated in a different direction according to still another embodiment of the present invention.
Figure 17:
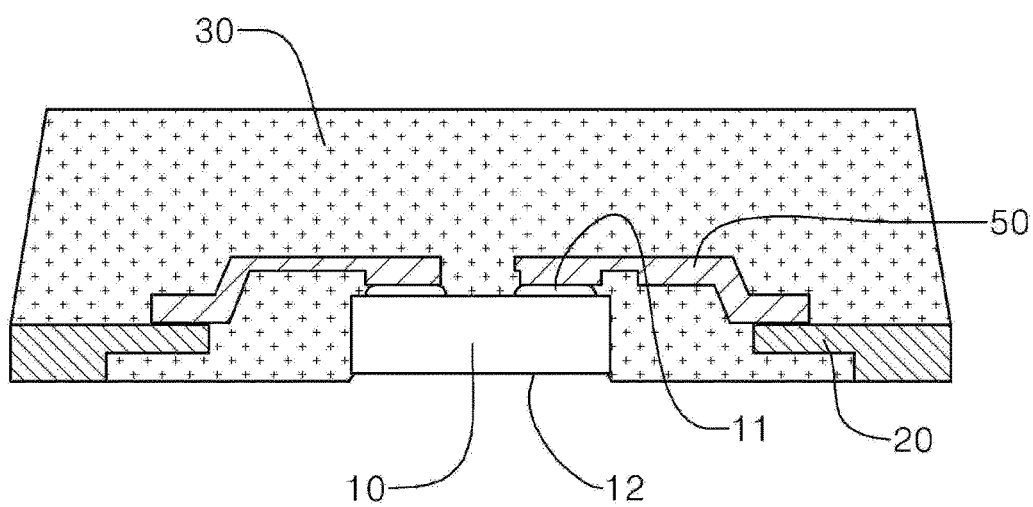

Such clip members 50 are also used in an embodiment in which the bottom surface 12 of a semiconductor chip 10 is oriented downward, as shown in FIGS. 16 to 17, thereby enabling the heat, generated in the semiconductor chip 10, to be dissipated via the lower surface of a package body 30.

Furthermore, the embodiment using the clip members 50 may be also configured such that the cutout hole 31 may be formed or the formed cutout hole 31 may be filled with the filling material 40, thereby enabling heat dissipation to be performed, like the embodiment not using the clip members 50.

According to the present invention, heat dissipation is facilitated by exposing the bottom surface of the semiconductor chip via the package body, thereby preventing the chip from being erroneously operated and damaged.

Furthermore, the cutout hole is formed in the package body and filled with the filling material, thereby enabling heat dissipation to be performed and also providing the effect of facilitating a soldering operation that is performed in a portion where the lower surface of the filling material and a board come into contact with each other when the semiconductor chip package is mounted on the board.

Moreover, the clip members are disposed between the semiconductor terminals and the lead frames, thereby achieving the effect of improving conductivity and heat dissipation.

While the present invention has been described with reference to the embodiments, it will be apparent that various modifications and alterations can be made without departing from the scope of the technical spirit of the present invention. It will be apparent that these modifications and alterations fall within the range of the rights of the present invention.

What is claimed is:

1. A semiconductor chip package comprising:
   a semiconductor chip configured such that terminals made of a solder material are formed on a first surface thereof and are arranged in two rows along a longitudinal direction, and the terminals are not formed on a second surface thereof, which is a bottom surface;
   lead frames indirectly connected to the terminals of the semiconductor chip;
   clip members each disposed between the semiconductor chip and one of the lead frames, and configured to enable the terminals to be indirectly connected to the lead frames; and
   a package body configured to protect the semiconductor chip, the lead frames, and the clip members and to form an outside shape of the semiconductor chip package, and formed by molding;
   wherein the package body is partially cut out such that the second surface of the semiconductor chip is exposed to an outside, the second surface being disposed at a step down by a predetermined depth from an exterior surface of the package body;
   wherein the terminals are connected to the lead frames in a state in which the terminals of the semiconductor chip have been oriented toward an inside of the package body;
   wherein side surfaces of the lead frames in a same orientation with longitudinal side surfaces of the package body are exposed to the outside;
   wherein each of the lead frames includes a first lower surface exposed to the outside, and a second lower surface formed at a step down by a predetermined depth from the first lower surface such that the second lower surface is disposed inside the package body;
   wherein each of the clip members is connected to a portion of each of the lead frames including the second lower surface;
   wherein the first surface is a lower surface of the semiconductor chip, the second surface is an upper surface of the semiconductor chip, and the bottom surface of the semiconductor chip is exposed via an upper surface of the package body; and
   wherein the lead frames are formed in a non-bent shape and disposed at locations lower than the terminals of the semiconductor chip, and the clip members connected to the lead frames are bent upward to locations of the terminals and connected to the terminals.

2. The semiconductor chip package of claim 1, wherein the terminals protrude from the first surface of the semiconductor chip.

3. A semiconductor chip package comprising:
   a semiconductor chip configured such that terminals made of a solder material are formed on a first surface thereof and are arranged in two rows along a longitudinal direction, and the terminals are not formed on a second surface thereof, which is a bottom surface;
   lead frames indirectly connected to the terminals of the semiconductor chip;
   clip members each disposed between the semiconductor chip and one of the lead frames, and configured to enable the terminals to be indirectly connected to the lead frames; and
   a package body configured to protect the semiconductor chip, the lead frames, and the clip members and to form an outside shape of the semiconductor chip package, and formed by molding;
   wherein the package body is partially cut out such that the second surface of the semiconductor chip is exposed to an outside, the second surface being disposed at a step down by a predetermined depth from an exterior surface of the package body;
   wherein the terminals are connected to the lead frames in a state in which the terminals of the semiconductor chip have been oriented toward an inside of the package body;

wherein side surfaces of the lead frames in a same orientation with longitudinal side surfaces of the package body are exposed to the outside;

wherein each of the lead frames includes a first lower surface exposed to the outside, and a second lower surface formed at a step down by a predetermined depth from the first lower surface such that the second lower surface is disposed inside the package body;

wherein each of the clip members is connected to a portion of each of the lead frames including the second lower surface;

wherein the first surface is an upper surface of the semiconductor chip, the second surface is a lower surface of the semiconductor chip, and the bottom surface of the semiconductor chip is exposed via a lower surface of the package body; and wherein the lead frames are formed in a non-bent shape and disposed at locations lower than the terminals of the semiconductor chip, and the clip members connected to the lead frames are bent upward to locations of the terminals and connected to the terminals.

* * * * *